United States Patent
Lubomirsky et al.

(10) Patent No.: US 8,333,842 B2
(45) Date of Patent: Dec. 18, 2012

(54) APPARATUS FOR ETCHING SEMICONDUCTOR WAFERS

(75) Inventors: Dmitry Lubomirsky, Cupertino, CA (US); Tien Fak Tan, Fremont, CA (US); Lun Tsuei, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 542 days.

(21) Appl. No.: 12/121,599

(22) Filed: May 15, 2008

(65) Prior Publication Data

US 2009/0283217 A1   Nov. 19, 2009

(51) Int. Cl.
*H01L 21/3065* (2006.01)

(52) U.S. Cl. ..... 118/728; 361/234; 279/128; 118/723 R; 156/345.23

(58) Field of Classification Search .............. 118/723 R, 118/728, 724; 361/234; 279/128; 269/21; 156/345.23
See application file for complete search history.

(56) References Cited

U.S. PATENT DOCUMENTS

| | | | |
|---|---|---|---|
| 2,807,180 A | 9/1957 | Adams | |
| 3,955,163 A * | 5/1976 | Novak | 355/132 |
| 5,171,398 A * | 12/1992 | Miyamoto | 156/552 |
| 5,676,205 A | 10/1997 | White | |
| 5,994,678 A * | 11/1999 | Zhao et al. | 219/530 |
| 6,464,795 B1 * | 10/2002 | Sherstinsky et al. | 118/728 |
| 6,844,921 B2 | 1/2005 | Komatsu | |
| 2003/0209443 A1 * | 11/2003 | Lubomirsky | 205/137 |
| 2009/0283217 A1 * | 11/2009 | Lubomirsky et al. | 156/345.34 |

FOREIGN PATENT DOCUMENTS

| | | |
|---|---|---|
| JP | 2002-256439 A | 9/2002 |
| JP | 2003-158173 A | 5/2003 |
| JP | 2008-108766 A | 5/2008 |
| KR | 10-2001-0034921 A | 4/2001 |

OTHER PUBLICATIONS

Search Report for PCT Application No. PCT/US2009/043261 mailed on Dec. 23, 2009; 2 pages.
Written Opinion for PCT Application No. PCT/US2009/043261 mailed on Dec. 23, 2009; 4 pages.

* cited by examiner

*Primary Examiner* — Sylvia R. MacArthur
(74) *Attorney, Agent, or Firm* — Kilpatrick Townsend & Stockton LLP (57) ABSTRACT

A wafer pedestal of a semiconductor apparatus is provided. The wafer pedestal is capable of supporting a substrate. The wafer pedestal includes a pedestal having at least one purge opening configured to flow a purge gas and at least one chucking opening configured to chuck the substrate over the pedestal. The pedestal includes a sealing band disposed between the at least one purge opening and the at least one chucking opening. The sealing band is configured to support the substrate.

18 Claims, 6 Drawing Sheets

APPARATUS FOR ETCHING SEMICONDUCTOR WAFERS

FIELD OF THE INVENTION

The present invention relates to components and apparatus for semiconductor manufacturing. More particularly, the present invention relates to wafer pedestal and semiconductor apparatuses thereof.

BACKGROUND OF THE INVENTION

When processing silicon wafers, a good product requires surface uniformity. Achieving surface uniformity, etch, clean and/or preclean processes are implemented to remove semiconductor materials, dielectric materials and/or metallic materials. Usually, an etching process uses various reactants and/or plasmas to remove semiconductor materials and generated byproducts. The reactants and byproducts may undesirably condense, forming particles within the etch processing chamber. The particles and/or byproducts formed within the processing chamber may adversely affect surface uniformity of the substrates.

For a conventional etch apparatus, a pedestal is configured to support a wafer within an etch chamber for an etch process. The pedestal has a sealing band at the edge of the pedestal for contacting with the substrate. A cooling water flows through the pedestal for cooling the pedestal, such that etchants can deposit on the wafer. The pedestal also has a plurality of chucking holes surrounded by the sealing band. During an etch process, a gas is exhausted through the chucking holes to chuck the substrate with the pedestal. After the substrate is dechucked and lifted from the pedestal, the sealing band is exposed to the etchants and/or byproducts of the etch process. The etchants and/or byproducts are prone to condensing on the sealing band disposed at the edge of the pedestal due to the cooling effect by the cooling wafer flowing through the pedestal. When another wafer is chucked on the pedestal to be etched, the condensing byproducts and/or particles on the sealing band may tilt the substrate, resulting in a non-uniform etch to the wafer.

BRIEF SUMMARY OF THE INVENTION

Embodiments of the present invention pertain to wafer pedestal and semiconductor apparatus thereof that provide benefits over previously known wafer chucks by configuring the sealing band toward the center of the pedestal and distant from the edge of the pedestal. In embodiments, the sealing band may be configured between the chucking openings and purge openings of the pedestal. The sealing band may be disposed distant from the edge of the pedestal to desirably prevent the condensation of reactants and/or byproducts on the sealing band during sublimation. A purge gas flowing through the purge openings may also desirably remove reactants and/or byproducts near to the sealing band. Additionally, the location of the sealing band can desirably prevent the deflection of the substrate on the pedestal during chucking the substrate.

Embodiments of the invention include a wafer pedestal of a semiconductor apparatus. The wafer pedestal is capable of supporting a substrate. The wafer pedestal may include a pedestal having at least one purge opening configured to flow a purge gas and at least one chucking opening configured to chuck the substrate over the pedestal. The pedestal may also include a sealing band disposed between the at least one purge opening and the at least one chucking opening. The sealing band is configured to support the substrate.

Additional embodiments of the invention may include a semiconductor apparatus. The semiconductor apparatus may include a chamber defining a processing region. A showerhead may be disposed at a top region of the chamber. A wafer pedestal may be disposed at a bottom region of the chamber. The wafer pedestal may include a pedestal having at least one purge opening configured to flow a purge gas and at least one chucking opening configured to chuck the substrate over the pedestal. The pedestal may also include a sealing band disposed between the at least one purge opening and the at least one chucking opening. The sealing band is configured to support the substrate.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

The present invention relates to wafer pedestal and semiconductor apparatus for etching, cleaning or precleaning substrates, such as silicon wafers, liquid crystal display substrates, solar panel substrates, and others. In embodiments, the wafer pedestal can be used in a deposition chamber such as a chemical vapor deposition (CVD) chamber. A wafer pedestal of a semiconductor apparatus is capable of supporting a substrate. The wafer pedestal may include a pedestal having at least one purge opening configured to flow a purge gas and at least one chucking opening configured to chuck the substrate over the pedestal. The pedestal may also include a sealing-band disposed between the at least one purge opening and the at least one chucking opening. The sealing band is configured to support the substrate. The configuration of the sealing band can desirably prevent the condensation of reactants and/or byproducts on the sealing band during sublimation. Additionally, the location of the sealing band can desirably prevent the deflection of the substrate on the pedestal during chucking the substrate.

Figure 1:
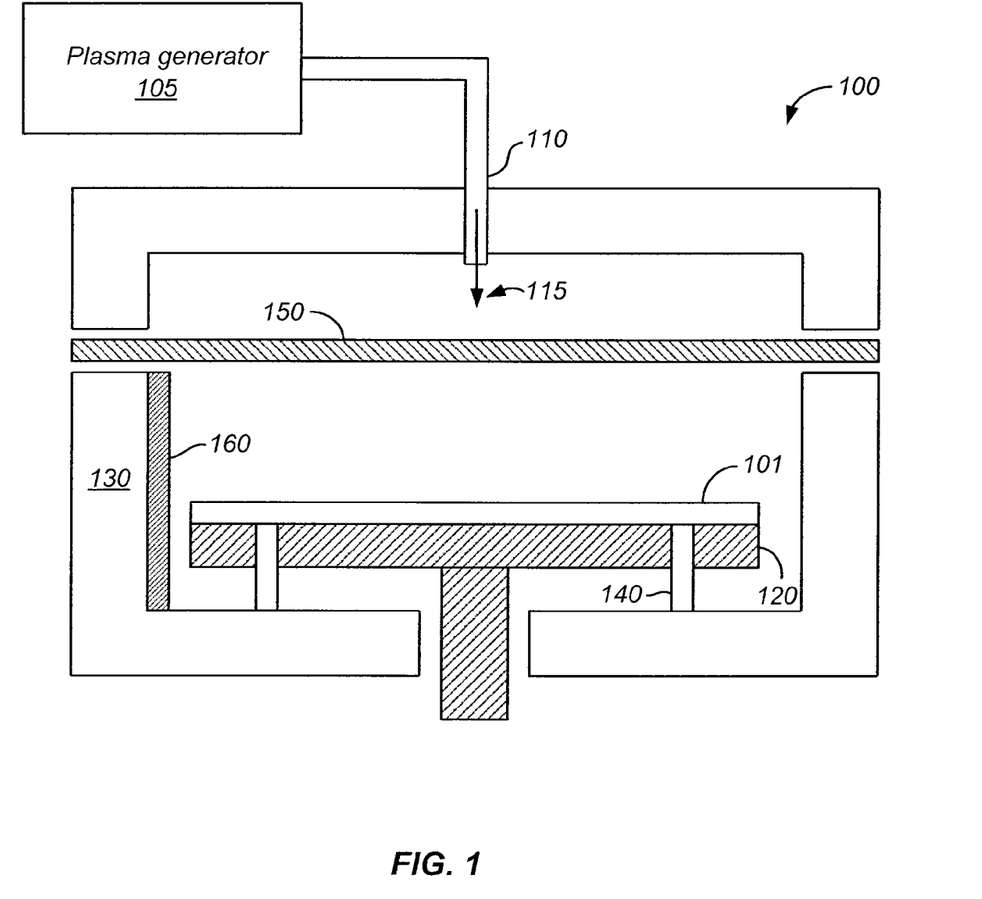
FIG. 1 is a schematic cross-sectional view of an exemplary etch apparatus of the present invention.

FIG. 1 is a schematic cross-sectional view of an exemplary etch apparatus of the present invention. In FIG. 1, etch apparatus 100 includes a processing chamber 130 defining a processing region (not labeled). Etch apparatus 100 also includes a plasma distribution apparatus 110 such as a tube, pipe and/or manifold for dispersing a processing plasma 115 to a substrate 101 that rests on a wafer pedestal 120 centered within processing chamber 130. Etch apparatus 100 can be fluidly coupled with a plasma generator 105 through plasma distribution apparatus 110. Plasma generator 105 is configured to generate processing plasma 115, which is delivered over substrate 101. Substrate 101 can be controllably moved between a lower position/upper position near to a showerhead 150 by pins 140. Substrate 101 can include at least one semiconductor structure such as semiconductor films, diodes, devices, transistors, interconnection, circuits, or various combinations thereof. In embodiments, etch apparatus 100 can be, for example, a SiConi™ Preclean chamber/system, available from Applied Materials, Inc. of Santa Clara, Calif.

Plasma distribution apparatus 110 can introduce etching plasma 115 generated by plasma generator 105 into processing chamber 130. In some embodiments, the supply line for etching plasma 115 can include (i) several safety shut-off valves (not shown) that can be used to automatically or manually shut-off the flow of processing plasmas into the chamber, and (ii) mass flow controllers (not shown) that measure the flow of processing plasmas 115 through the supply line.

In FIG. 1, the chamber wall (not labeled) of processing chamber 130 can have a temperature to substantially prevent condensations of etchants and/or byproducts of an etching process on the chamber wall. Wafer pedestal 120 can be operative to provide a desired temperature between about −100° C. and about 1,000° C. to condense etchants on the surface of substrate 101, such that the etchants can interact with the material on substrate 101. In embodiments, the temperature of wafer pedestal 120 can be around 30° C. The etchants interact with the material on substrate 101 so as to generate byproducts. After the generation of the byproducts, pins 140 are operative to lift substrate 101 toward showerhead 150. Showerhead 150 can be operative to provide a processing temperature between about −50° C. and about 1,000° C. to decompose and/or sublimate the byproducts. In embodiments, the temperature of showerhead 150 can be about 180° C. By the decomposition and/or sublimation process, the material on substrate 101 is removed. The process of decomposing the byproducts can be a sublimation process, for example.

As shown in FIG. 1, at least one pumping channel 160 can be configured within etch chamber 130 to desirably remove the etchants, byproducts, and/or decomposed gases. Pumping channel 160 can be coupled with, for example, a pump or motor (not shown) which is configured to remove the byproducts and/or etchants. In embodiments, pumping channel 160 may have at least one aperture (not shown) through which the byproducts can be desirably removed.

In some embodiments, a RF power supply (not shown) can be coupled with plasma generator 105 to excite an etchant gas to form etching plasma 115. The RF power supply can be operative to provide a RF power between about 5 watts and about 3,000 watts. The RF power supply can supply the power at a RF frequency between about 100 kHz and about 64 MHz.

A system controller (not shown) can control all of the activities of the etch system. The system controller executes a system control software, which is a computer program stored in a computer-readable medium such as a memory. In embodiments, the memory is a hard disk drive, but the memory may also be other kinds of memory. The computer program includes sets of instructions that dictate the timing, mixture of gases, chamber pressure, chamber temperature and other parameters of a particular process. Other computer programs stored on other memory devices including, for example, a floppy disk or other another appropriate drive, can also be used to operate controller.

A process for etching portions of a film over a substrate can be implemented using a computer program product that is executed by the controller described above. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 2:
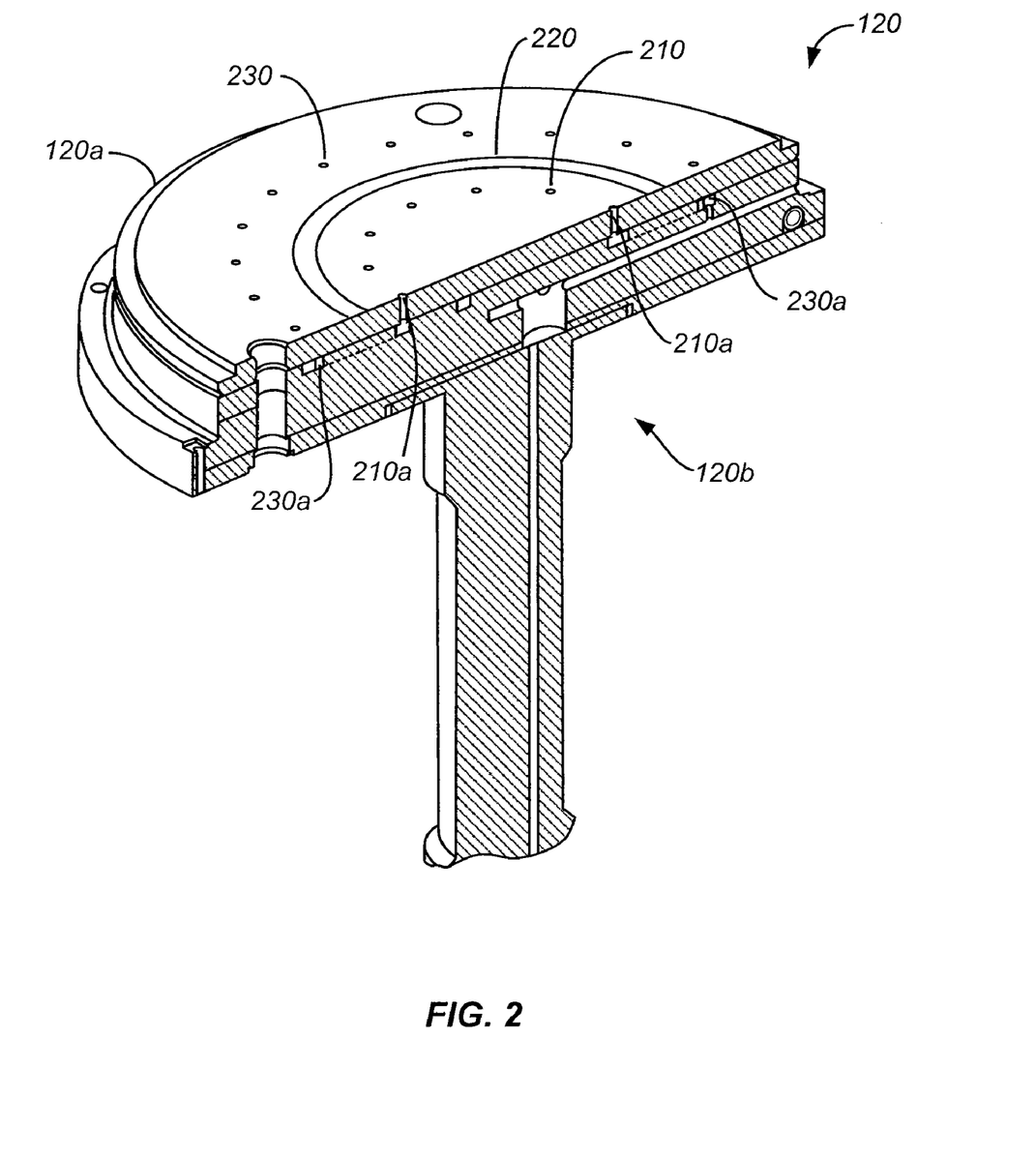
FIG. 2 is a schematic drawing showing an exemplary wafer pedestal of the present invention.

FIG. 2 is a schematic drawing showing an exemplary wafer pedestal of the present invention. In FIG. 2, wafer pedestal 120 includes a pedestal 120a and a pedestal base 120b. Pedestal 120a can be assembly coupled with pedestal base 120b. In embodiments, pedestal 120a is a ceramic pedestal, such as an aluminum oxide ($Al_2O_3$) pedestal. Pedestal base 120b can be a metallic pedestal. Metallic pedestal base 120b can include a plurality of metallic components which are brazed, for example.

As shown in FIG. 2, pedestal 120a includes at least one chucking opening 210 and at least one purge openings 230. Further, pedestal 120a can include a sealing band 220 disposed between chucking openings 210 and purge openings 230. Sealing band 220 and pedestal 120a can have the same material. Chucking openings 210 are configured to chuck substrate 101 (shown in FIG. 1) on wafer pedestal 120 during an etch process. Purge openings 230 are configured to flow a purge gas for purging etchants and/or byproducts away from sealing band 220. Sealing band 220 is configured to contact and/or support substrate 101 during a chucking status. Chucking openings 210 can be disposed closer to the center of pedestal 120a than purging openings 230. In embodiments, sealing band 220 is disposed away from the edge of pedestal 120a such that etchants and/or byproducts generated during an etching process can be substantially free from being condensed on sealing band 220.

In embodiments, sealing band 220 is disposed such that a processing pressure applied over substrate 101 (shown in FIG. 1) is substantially compensated by a chucking pressure during an etching process. By substantially nulling the processing pressure with the chucking pressure, the configuration of sealing band 220 can desirably prevent the center and/or edge deflections of substrate 101 during an etching process. For embodiments of 12-inch etch apparatus, sealing band 220 is disposed from the center of pedestal 120a between about 2.5 inches and about 4 inches. In embodiments, sealing band 220 is distant from the center of pedestal 120a about 2.5 inches.

Table I shows relationships between the location of sealing band 220 and center and edge deflections of substrate 101. In Table I, pedestal 120a has a diameter of about 12 inches, the wafer thickness is about 750 μm, the pressure difference between the processing pressure and the chucking pressure is about 0.5 Torr, Young's modulus (E) is about $18.8 \times 10^6$ psi, and poisson ratio (v) is about 0.28.

TABLE I

| Distance from the center of the pedestal to the sealing band | Center deflection (mil) | Edge deflection (mil) |
| --- | --- | --- |
| 2.5 inches | −0.4 | 0.56 |
| 3 inches | −0.85 | 0.94 |
| 4 inches | −2.9 | 1.9 |
| 6 inches | −17.2 | 0 |

As shown in Table I, sealing band 220 disposed at the location distant from the center of pedestal 120a about 2.5 inches can achieve desired center and edge deflections of substrate 101 than that disposed at the location distant from the center of pedestal 120a about 3, 4, or 6 inches. It is noted that the scope of the invention is not limited to the embodiments illustrated above. One of ordinary skill in the art is able to modify the location of sealing band 220 to achieve desired center and edge deflections.

Figure 3:
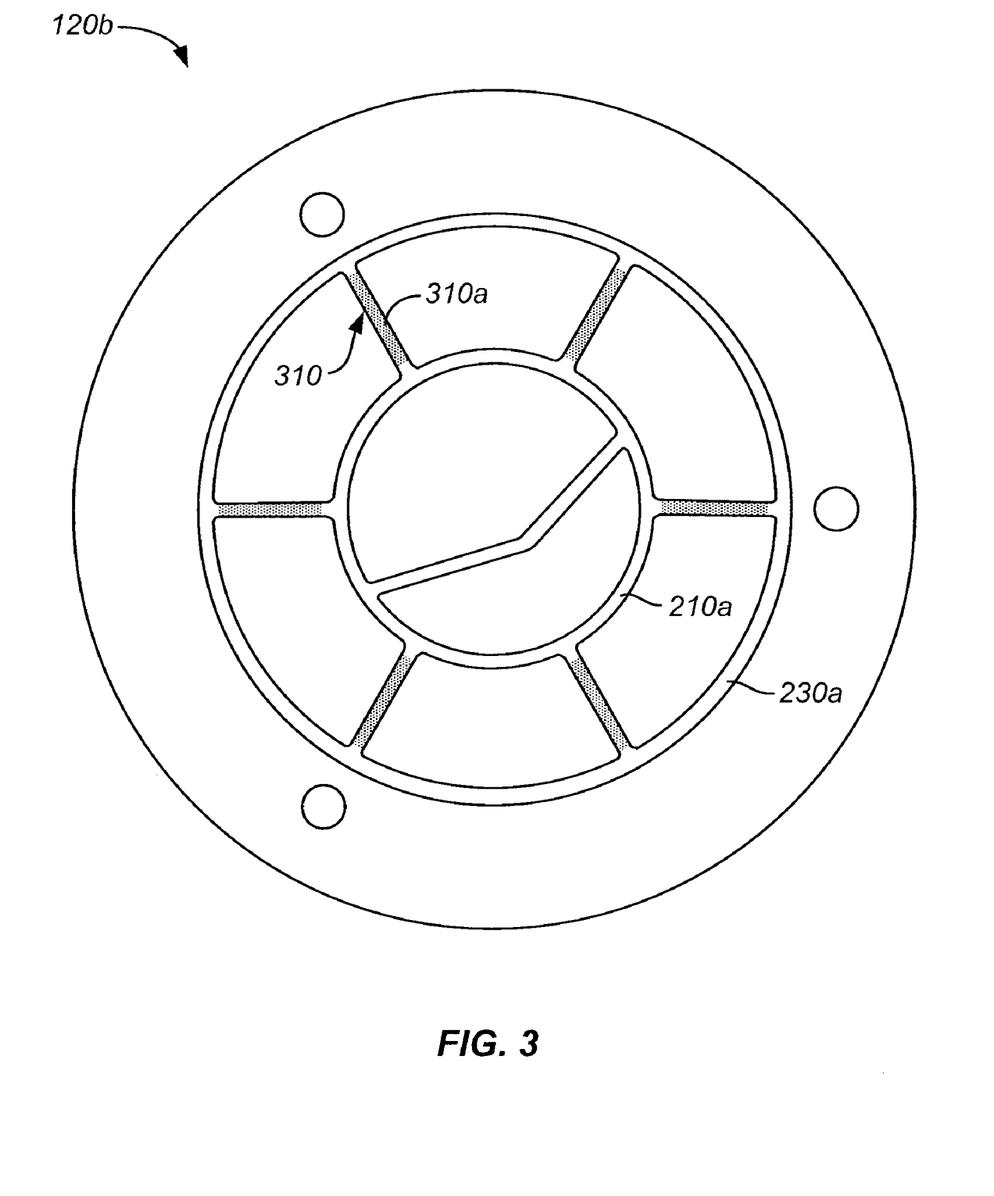
FIG. 3 is a top view of an exemplary pedestal base according to the present invention.

In FIG. 2, chucking openings 210 are fluidly coupled with circular chucking channel 210a between pedestal 120a and pedestal base 120b. Purging openings 230 are fluidly coupled with circular purging channel 230a between pedestal 120a and pedestal base 120b. FIG. 3 is a top view of an exemplary pedestal base according to the present invention. In FIG. 3, circular purging channel 230a is more distant away from the center of pedestal base 120b than circular chucking channel 210a. In embodiments, circular purging channel 230a can be coupled with circular chucking channel 210a by at least one isolation channel 310. Each isolation channel 310 includes an isolation material 310a such as Teflon to isolate circular purging channel 230a from circular chucking channel 210a. For embodiments of 12-inch etch apparatus, circular chucking channel 210a can be distant from the center of pedestal base 120b about 2.25 inches and circular purging channel 230a can be distant from the center of pedestal base 120b about 4.25 inches.

Figure 4:
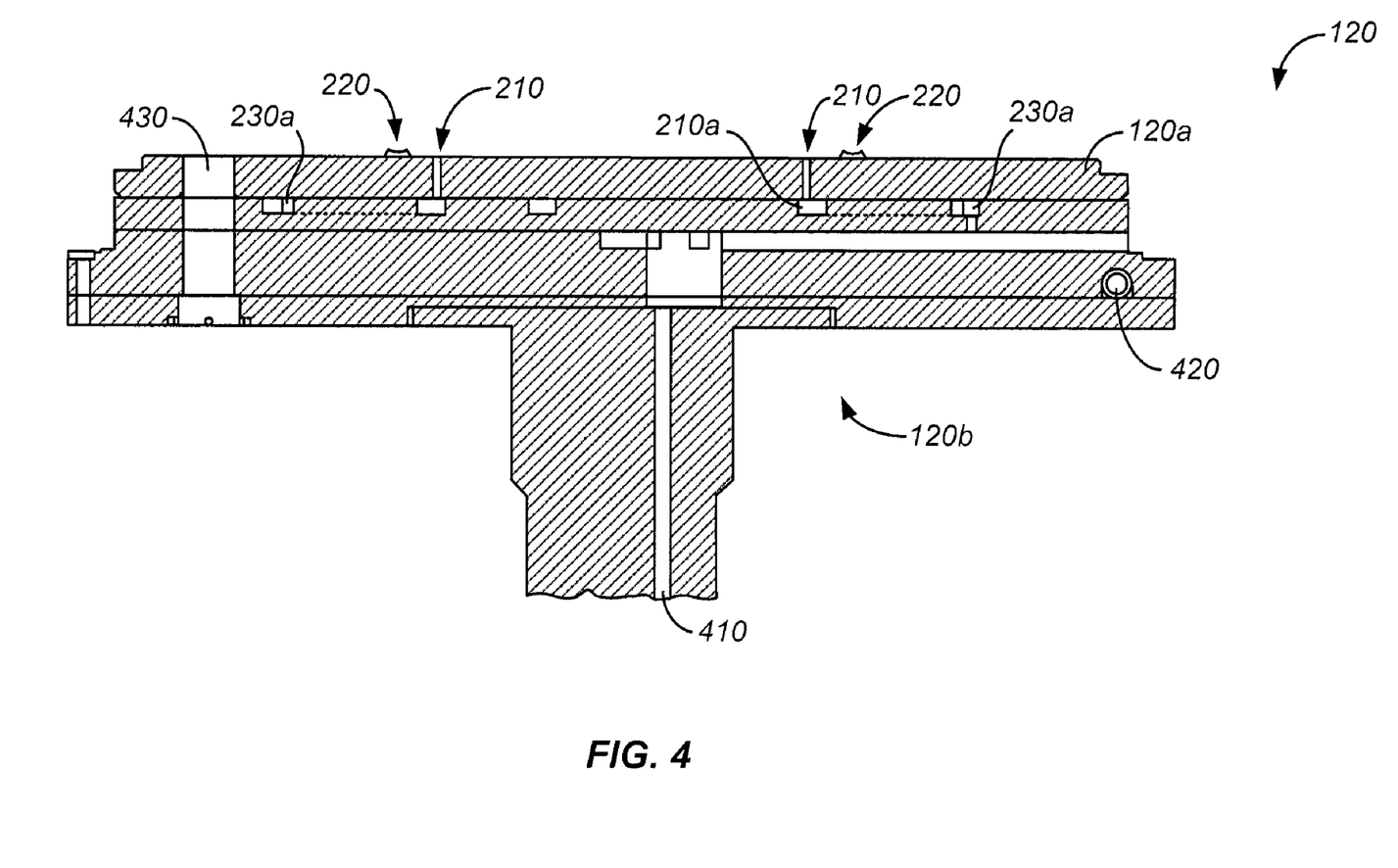
FIG. 4 is a cross-sectional view of an exemplary wafer pedestal of the present invention.

FIG. 4 is a cross-sectional view of an exemplary wafer pedestal of the present invention. In FIG. 4, pedestal 120a is disposed over pedestal base 120b. Gas inlet passage 410 is fluidly coupled with circular purging channel 230a to provide a purge gas. Cooling channel 420 is configured within pedestal base 120b to provide a cooling fluid such as liquid and/or gas to provide a desired temperate to pedestal base 120b and pedestal 120a. Opening 430 is configured within pedestal 120a and pedestal base 120b through which pin 140 (shown in FIG. 1) can be controllably movable to lift substrate 101 (shown in FIG. 1).

Figure 5:
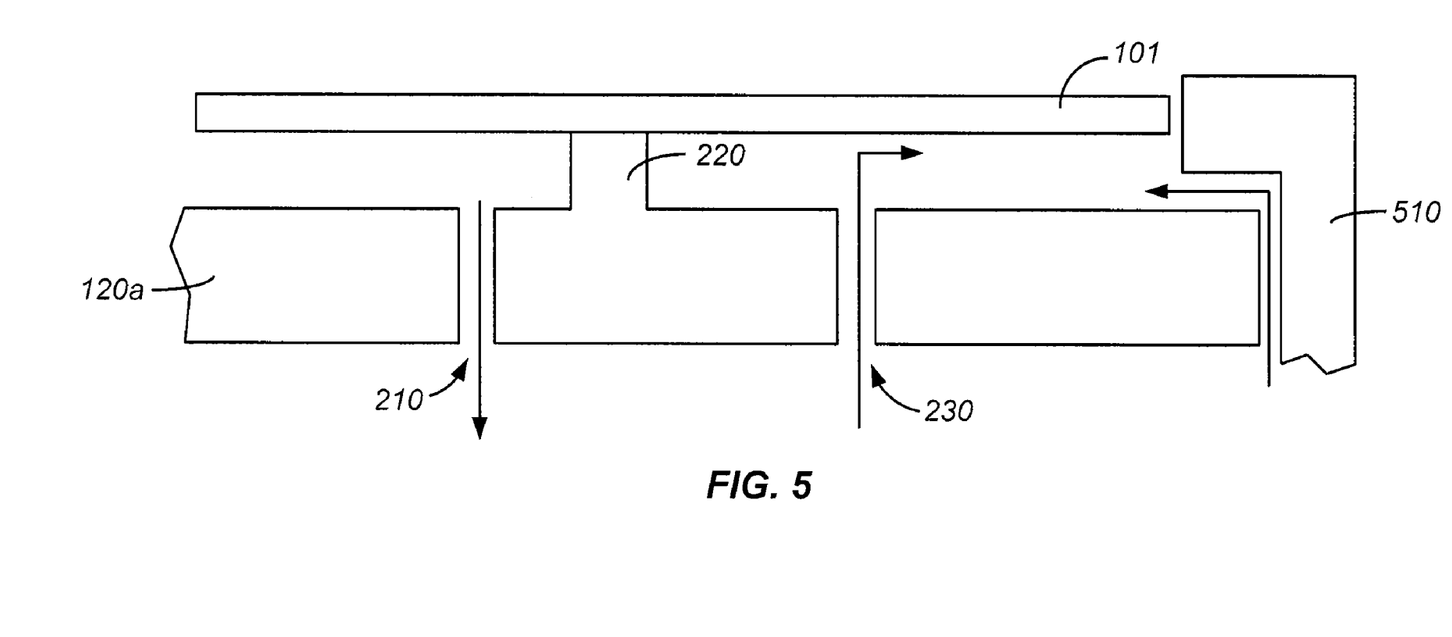
FIG. 5 is a schematic drawing showing chucking a substrate over a pedestal.

FIG. 5 is a schematic drawing showing chucking a substrate over a pedestal. In FIG. 5, substrate 101 is chucked over pedestal 120a, contacting with sealing band 220. Edge ring 510 is configured to clamp pedestal 120a over pedestal base 120b. During generation of etchants and/or condensation of etchants, a processing pressure is generated over substrate 101. The processing pressure may result in the deflection of substrate 101. In order to avoid the deflection of substrate 101, a gas flow can be exhausted through chucking opening 210 to generate a chucking pressure to substantially compensate the processing pressure. Additionally, a purge gas can be provided through purge opening 230 and the gap (not labeled) between pedestal 120a and edge ring 510 to purge etchants and/or byproducts of the etch process. The purge gas desirably removes the etchants and/or byproducts generated during the etching process such that etchants and/or byproducts are substantially free from condensing on sealing band 220.

Figure 6:
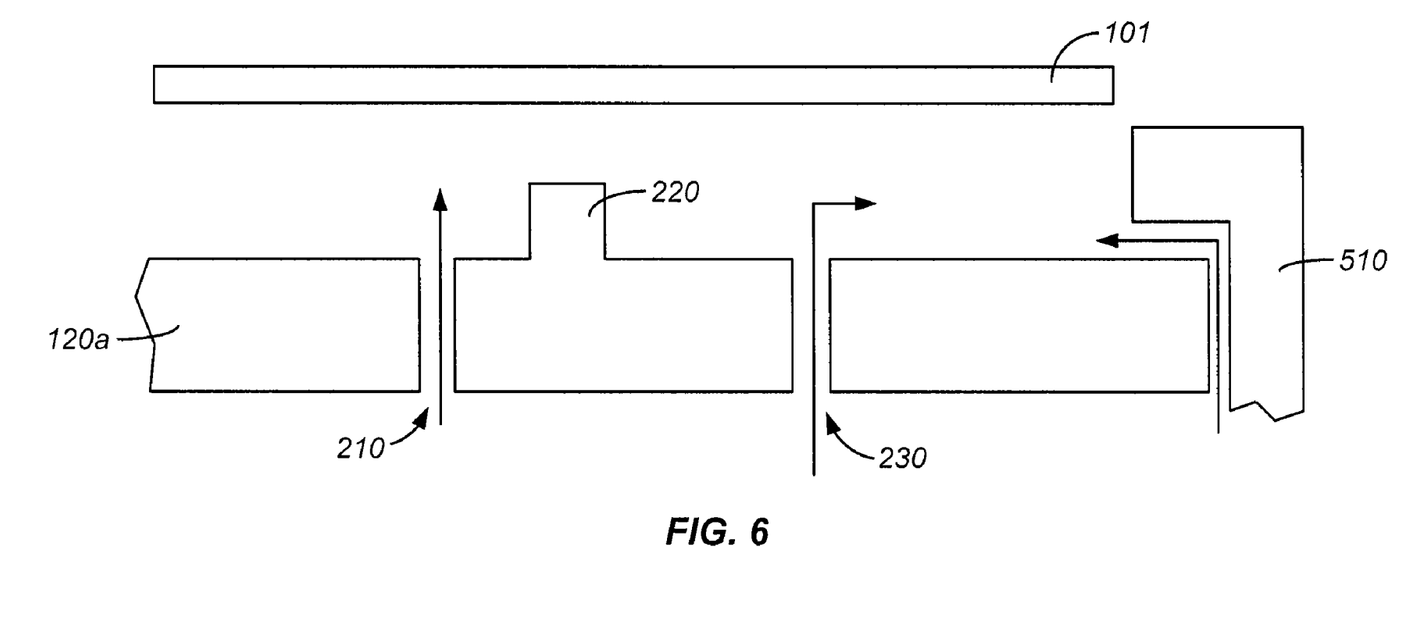
FIG. 6 is a schematic drawing showing dechucking a substrate from a pedestal.

FIG. 6 is a schematic drawing showing dechucking a substrate from a pedestal. During sublimation, substrate 101 is lifted toward heated showerhead 150 by pins 140 (not shown in FIG. 6, but shown in FIG. 1). A purge gas can be provided through chucking opening 210, purging opening 230, and/or the gap between pedestal 120a and edge ring 510 to prevent condensation of particles and/or byproducts on sealing band 220. As shown, sealing band 220 is disposed away from the edge of pedestal 120a. The etchtants and/or byproducts need to flow a distance from the edge of substrate 101 to reach and condense on sealing band 220. The distance can desirably reduce the chance of the condensation of the byproducts and/or particles on sealing band 220. Since sealing band 220 is substantially free from condensing byproducts and/or particles, the surface of substrate 101 processed within chamber 130 can be desirably leveled and an uniform etch can be achieved.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise", "comprising", "include", "including", and "includes" when used in this specification and in the following claims are intended to specify the presence of stated features, integers, components, or steps, but they do not preclude the presence or addition of one or more other features, integers, components, steps, acts, or groups.

What is claimed is:

1. A wafer pedestal of a semiconductor apparatus, the wafer pedestal capable of supporting a substrate, the wafer pedestal comprising:
   an upper surface, the upper surface having purge openings configured to allow a flow of a purge gas and chucking openings configured to allow chucking of the substrate over the pedestal;
   a sealing band disposed on the upper surface and configured to contact the substrate, wherein the sealing band is disposed between the purge openings and the chucking openings; and
   a recessed region surrounding the sealing band, wherein the purge openings are disposed within the recessed region, and the recessed region is configured to provide a gap between the upper surface of the pedestal and the substrate such that when the substrate is supported by the wafer pedestal, the sealing band contacts the substrate inward from an edge of the substrate and the edge of the substrate extends over the recessed region.

2. The wafer pedestal of claim 1 wherein the at least one chucking opening is closer to a center of the pedestal than the at least one purge opening.

3. The wafer pedestal of claim 1 wherein the sealing band is disposed distant away from an edge of the pedestal toward a center of the pedestal such that a by-product generated during an etching process is substantially free from being formed on the sealing band.

4. The wafer pedestal of claim 3 wherein the sealing band is distant from the center of the pedestal between about 2.5 inches to about 4 inches.

5. The wafer pedestal of claim 1 wherein the sealing band is disposed on the upper surface of the pedestal such that a processing pressure is substantially compensated by a chucking pressure during an etch process.

6. The wafer pedestal of claim 1 further comprising a pedestal base assembly coupled with the pedestal, wherein the pedestal is a ceramic pedestal and the pedestal base assembly is a metallic pedestal.

7. The wafer pedestal of claim 6 wherein the pedestal base assembly has at least one circular chucking channel and at least one circular purging channel, and the at least one circular chucking channel is closer to a center of the pedestal base assembly than the at least one circular purging channel.

8. The wafer pedestal of claim 7 wherein the at least one chucking opening is fluidly coupled with the at least one circular chucking channel and the at least one purge opening is fluidly coupled with the at least one circular purging channel.

9. The wafer pedestal of claim 8 wherein the circular chucking channel is coupled with the circular purging channel by at least one isolation channel which is configured to isolate the circular chucking channel and the circular purging channel.

10. A semiconductor apparatus comprising:
    a chamber defining a processing region;
    a showerhead disposed at a top region of the chamber; and
    a wafer pedestal disposed at a bottom region of the chamber, wherein the wafer pedestal comprises:
        an upper surface, the upper surface having purge openings configured to allow a flow of a purge gas and chucking openings configured to allow chucking of the substrate over the pedestal;
        a sealing band disposed on the upper surface and configured to contact the substrate, wherein the sealing band is disposed between the purge openings and the chucking openings; and
        a recessed region surrounding the sealing band, wherein the purge openings are disposed within the recessed region, and the recessed region is configured to provide a gap between the upper surface of the pedestal and the substrate such that when the substrate is supported by the wafer pedestal, the sealing band contacts the substrate inward from an edge of the substrate and the edge of the substrate extends over the recessed region.

11. The semiconductor apparatus of claim 10 wherein the at least one chucking opening is closer to a center of the pedestal than the at least one purge opening.

12. The semiconductor apparatus of claim 10 wherein the sealing band is disposed distant away from an edge of the pedestal toward a center of the pedestal such that a by-product generated during an etching process is substantially free from being formed on the sealing band.

13. The semiconductor apparatus of claim 12 wherein the sealing band is distant from the center of the pedestal between about 2.5 inches to about 4 inches.

14. The semiconductor apparatus of claim 10 wherein the sealing band is disposed on the upper surface of the pedestal such that a processing pressure is substantially compensated by a chucking pressure during an etch process.

15. The semiconductor apparatus of claim 10 wherein the wafer pedestal further comprises a pedestal base assembly coupled with the pedestal, wherein the pedestal is a ceramic pedestal and the pedestal base assembly is a metallic pedestal.

16. The semiconductor apparatus of claim 15 wherein the pedestal base assembly has at least one circular chucking channel and at least one circular purging channel, and the at least one circular chucking channel is closer to a center of the pedestal base assembly than the at least one circular purging channel.

17. The semiconductor apparatus of claim 16 wherein the at least one chucking opening is fluidly coupled with the at least one circular chucking channel and the at least one purge opening is fluidly coupled with the at least one circular purging channel.

18. The semiconductor apparatus of claim 17 wherein the circular chucking channel is coupled with the circular purging channel by at least one isolation channel which is configured to isolate the circular chucking channel and the circular purging channel.

* * * * *